US00RE42283E

(19) United States
(12) Reissued Patent
Chu et al.

(10) Patent Number: US RE42,283 E
(45) Date of Reissued Patent: Apr. 12, 2011

(54) LCD AND METHOD OF IMPROVING THE BRILLIANCE OF THE SAME

(75) Inventors: Hung-Jen Chu, Nantou (TW); Ming-Hsuan Chang, Sanchung (TW); Chien-Kuo Ho, Taipei (TW); Nai-Jen Hsiao, Chiai (TW)

(73) Assignee: Chunghwa Picture Tubes, Ltd., Taipei (TW)

(21) Appl. No.: 11/325,697

(22) Filed: Jan. 3, 2006

Related U.S. Patent Documents

Reissue of:
(64) Patent No.: 6,777,750
Issued: Aug. 17, 2004
Appl. No.: 10/262,899
Filed: Oct. 3, 2002

(30) Foreign Application Priority Data

Oct. 3, 2001 (TW) ..... 90124448

(51) Int. Cl.
*H01L 29/04* (2006.01)
*H01L 31/20* (2006.01)
*H01L 31/036* (2006.01)
*H01L 31/0376* (2006.01)

(52) U.S. Cl. ..... 257/59; 257/322; 257/347; 257/E21.32; 257/E21.351; 257/E21.403; 257/E21.421; 257/E21.464; 257/E21.617

(58) Field of Classification Search ..... 257/59, 257/347, 322, 192, 197, 213, 288, 350, 414, 257/565, E21.32, 351, 403, 421, 464, 617
See application file for complete search history.

(56) References Cited

U.S. PATENT DOCUMENTS

| | | | | | |
|---|---|---|---|---|---|
| 5,834,321 | A | * | 11/1998 | Salisbury | 438/4 |
| 6,284,558 | B1 | * | 9/2001 | Sakamoto | 438/30 |
| 6,362,032 | B1 | * | 3/2002 | Kim et al. | 438/158 |
| 6,506,617 | B1 | * | 1/2003 | Cheng | 438/22 |
| 6,573,532 | B2 | * | 6/2003 | Park | 257/59 |
| 6,664,568 | B2 | * | 12/2003 | Lai | 257/59 |
| 6,908,780 | B2 | * | 6/2005 | Lai | 438/30 |
| 7,105,855 | B2 | * | 9/2006 | Winters | 257/40 |

FOREIGN PATENT DOCUMENTS

| | | |
|---|---|---|
| JP | 2-234133 | 9/1990 |
| JP | 6-258666 | 9/1994 |
| JP | 7-147411 | 6/1995 |
| JP | 1997-260675 | 10/1997 |
| JP | 11-87717 | 3/1999 |
| JP | 2000-22156 | * 1/2000 |

* cited by examiner

*Primary Examiner*—David Nhu
(74) *Attorney, Agent, or Firm*—J.C. Patents

(57) ABSTRACT

A TFT liquid crystal display device is disclosed, which includes two substrates and a liquid crystal layer provided in between the substrates, one substrate having a surface providing with a plurality of data signal lines, a plurality of scan lines, a plurality of pixel electrodes, and a plurality of functional components having source electrode, gate electrodes and drain electrodes. Moreover, the projection of one of the signal electrode and the drain electrode on the gate electrode having at least one bridging zone and one conducting zone. The width of the bridging zone in the direction in parallel to one side of the gate electrode is smaller than the width of the conducting zone in the direction in parallel to the side of the gate electrode.

17 Claims, 2 Drawing Sheets

(A)
(Prior Art)

LCD AND METHOD OF IMPROVING THE BRILLIANCE OF THE SAME

Matter enclosed in heavy brackets [ ] appears in the original patent but forms no part of this reissue specification; matter printed in italics indicates the additions made by reissue.

*CROSS-REFERENCE TO RELATED APPLICATION*

*This application is a reissue of application Ser. No. 10/262,899 filed Oct. 3, 2002, U.S. Pat. No. 6,777,750.*

BACKGROUND OF THE INVENTION

1. Field of the Invention

The present invention relates to a TFT (thin-film transistor) flat panel display device and its manufacturing method and, more particularly, to a TFT LCD (liquid crystal display) that greatly improves the brilliance.

2. Description of Related Art

In recent years, TFT liquid crystal display devices greatly attract consumer's attention because their advantages such as lighter weight and thinner size. Liquid crystal display devices (LCDs) have been accepted by consumers more and more since the improvement in manufacturing process and prices. However, conventional LCDs still have drawbacks, for example, poor brilliance. The brilliance of a conventional LCD results from many factors. It is well known that the phenomenon of shot mura is very important. This phenomenon of shot mura happens owing to the inevitable drawbacks happens in manufacturing process of the conventional LCDs. The phenomena of shot mura frequently results form the accuracy error of alignment and exposure. When using an exposure stepper to expose light on the panel substrate in lithographic process, the alignment error between the exposure stepper and the panel substrate in different exposure steps results in a different overlapped area. This error causes variation of capacitance of pixel functional components in different exposure areas on the same panel substrate; therefore different voltages applied to the pixel electrodes as the electrodes are conducted, and further result in variation of brilliance.

The phenomenon of shot mura can be understood from the following description with reference to FIG. 1. As illustrated in FIG. 1, Area A 110 and Area B 120 are two adjacent exposure areas in the display panel 100 ready for the application of exposure step of lithographic process. When stepper achieves exposure of former light exposure area (e.g. Area A 110) and shifts to next light exposure area (e.g. Area A 120), the alignment errors are reduced through the help of alignment machines and the existence of overlapping components around the periphery of former light exposure area (e.g. Area A 110). However, machine alignment cannot completely eliminate alignment errors. This alignment error causes a deviation between the pattern of the functional components (thin film transistors) 200 in Area A 110 (see FIG. 2A) and the pattern of the functional components (thin film transistors) 300 in Area A 120 (see FIG. 2B). For example, the overlapped area 360 between the drains 330 and gates 320 of all functional components 300 of Area B are relatively greater than the overlapped area 260 between the drains 230 and gates 220 of all functional components 200 of Area A due to alignment errors. The deviation can be estimated through calculating the changes which happened in the overlapped area 440 of the signal electrode 410 above the gate 420 (see FIG. 3) of the functional components of a LCD panel of prior arts and in the overlapped area 450 (a rectangular zone in most cases) of a drain electrode 430 above a gate 420 of those. Because the overlapped area between the drains 230 and the gates 220 in Area A and the overlapped area between the drains 330 and the gates 320 in Area B are different, a capacitance difference between the pixel functional components 200 of Area A and the pixel functional components 200 of Area B produced. When data signal voltage passed the functional components, the feed through voltage A obtained from data signal voltage passing through drains and gates to pixel electrodes of Area A is not equal to the feed through voltage B obtained from data signal voltage passing through drains and gates to pixel electrodes of Area B. Moreover, since the brilliance is dependent on the feed through voltage, this feed through voltage difference also results in different brilliance between Zone A and Zone B. This is the so-called phenomenon of shot mura, which lowers the display quality of the TFT LCD.

Therefore, it is desirable to provide a TFT LCD that eliminates the aforesaid drawbacks.

SUMMARY OF THE INVENTION

It is the main object of the present invention to provide a liquid crystal display device to eliminate alignment error from the photo-exposure of lithographic process and the alignment errors of overlapped area between drains and gates in different exposure areas, to prevent the phenomenon of shot mura and to improve the uniformity of display panel brilliance.

It is another object of the present invention to provide a method for manufacturing a liquid crystal display device, to eliminate alignment error from the photo-exposure of lithographic process and the alignment errors of overlapped area between drains and gates in different exposure areas, to prevent the phenomenon of shot mura and to improve the uniformity of display panel brilliance, to improve the uniformity of display panel brilliance and to increase the yield rate of the fabrication.

To achieve these and other objects of the present invention, the liquid crystal display device comprises: a first substrate; a second substrate having a plurality of data lines, a plurality of scan lines, a plurality of pixel electrodes, and a plurality of functional components having drain electrodes, gate electrodes and signal electrodes; wherein said gate electrodes, said signal electrodes and said drain electrodes don't directly connect each other, a projection of one of each signal electrode or each drain electrode on a surface of a neighboring gate electrode having has at least one conducting zone, and said bridging zone is adapted for connecting said conducting zone; and a liquid crystal layer sandwiched and sealed between said first substrate and said second substrate; wherein said signal electrodes connect to said data lines, said gate electrodes connect to said scan lines, said drain electrodes connect to said pixel electrodes, said signal electrodes, said bridging zone has an equal width in the direction parallel to one peripheral side of said gate electrode, and the width of said bridging zone in the direction parallel to one peripheral side of said gate electrode is smaller than the width of said conducting zone in the direction parallel to said peripheral side of said gate electrode.

The method of improving the brilliance of a liquid crystal display device in accordance with the present invention comprises following steps: (a) providing a first substrate; a second substrate having a plurality of data lines, a plurality of scan lines, a plurality of pixel electrodes, and a plurality of functional components having drain electrodes, gate electrodes and source electrodes; wherein said gate electrodes, said signal electrodes and said drain electrodes don't directly connect each other, the projection of one of each signal electrode or each drain electrode on the surface of neighboring gate electrode having at least one conducting zone and one bridging zone for connecting said conducting zone and other part of said signal electrode and said drain electrode; and a liquid crystal layer; wherein said source electrodes connect to said data lines, said gate electrodes connect to said scan lines, and said drain electrodes connect to said pixel electrodes; said source electrodes, said bridging zone has an equal width in the direction parallel to one peripheral side of said gate electrode, and the width of said bridging zone in the direction parallel to one peripheral side of said gate electrode is smaller than the width of said conducting zone in the same direction parallel to said peripheral side of said gate electrode; and (b) sandwiching and sealing said liquid crystal layer between said first substrate and said second substrate.

Other objects, advantages, and novel features of the invention will become more apparent from the following detailed description when taken in conjunction with the accompanying drawings.

DETAILED DESCRIPTION OF THE PREFERRED EMBODIMENT

The functional components on the substrate of the LCD are so arranged that the width of the bridging zone in the direction parallel to the gate electrode peripheral side is smaller than the width of the conducting zone in the same direction parallel to the gate electrode peripheral side. Preferably, the width of the bridging zone in the direction parallel to the gate electrode peripheral side is about within the range between the width of the conducting zone in the same direction parallel to the gate electrode peripheral side and ¼ of the width of the conducting zone in the same direction in parallel to the gate electrode peripheral side. The shape of the projection of the bridging zone and the conducting zone on the gate surface is not limited. Preferably, the bridging zone and the conducting zone are integrated into "T" shape, "L" shape, "Z" shape, or "II" shape. Preferably, the LCD of the present invention comprises an orientation layer coated between the substrate and the liquid crystal layer. Selectively, the LCD of the present invention can further comprise a backlight module adapted to provide the LCD with the necessary illumination.

For easy understanding of the technical content of the present invention, the present invention is outlined hereinafter by way of an example.

Figure 1:
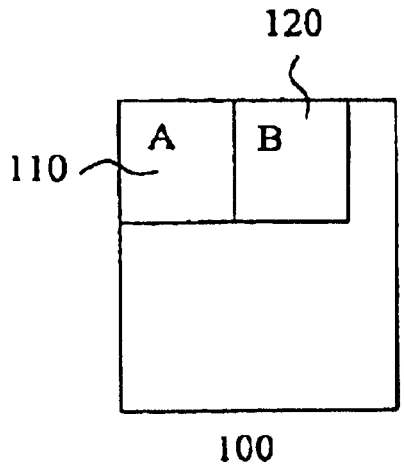
(Prior Art) Fig.1
FIG. 1 is a schematic drawing showing different areas on the display panel substrate properly exposed by the exposure stepper for lithographic process.
Figure 2:
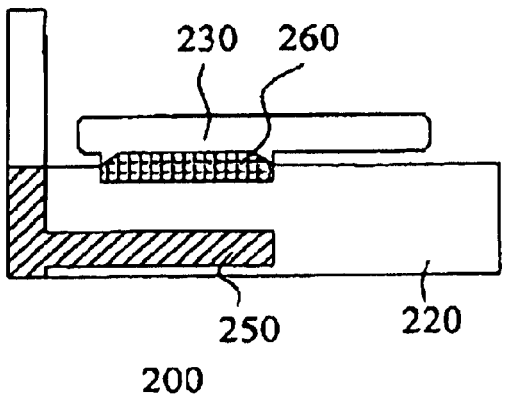
(Prior Art) Fig.2
FIG. 2 is a schematic drawing showing an error on a panel substrate produced by exposure stepper in a conventional lithographic process.
Figure 2:
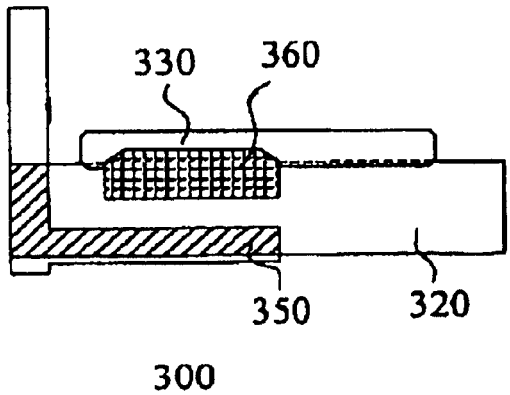
(Prior Art) Fig.2
Figure 3:
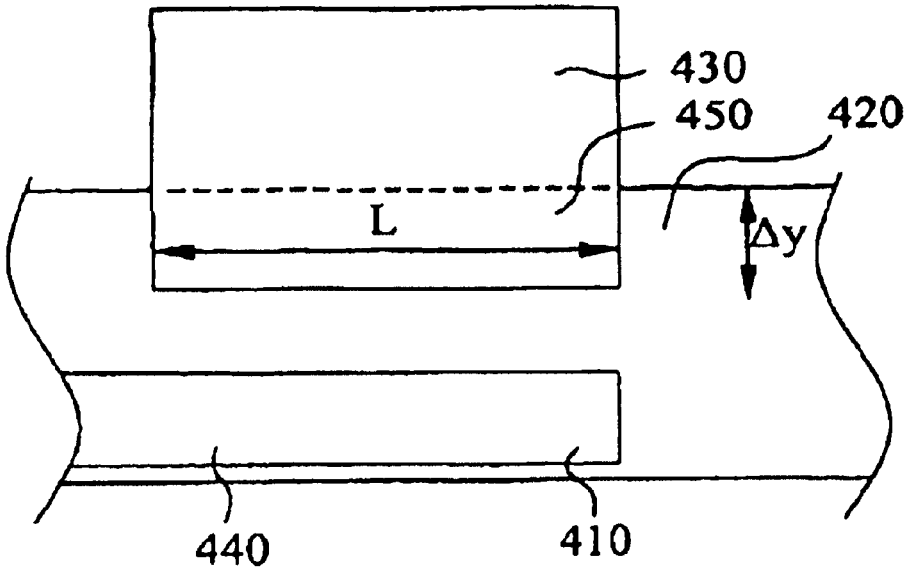
(Prior Art) Fig.3
FIG. 3 is a schematic drawing showing the arrangement of a functional component in a display panel according to the prior art.
Figure 4:
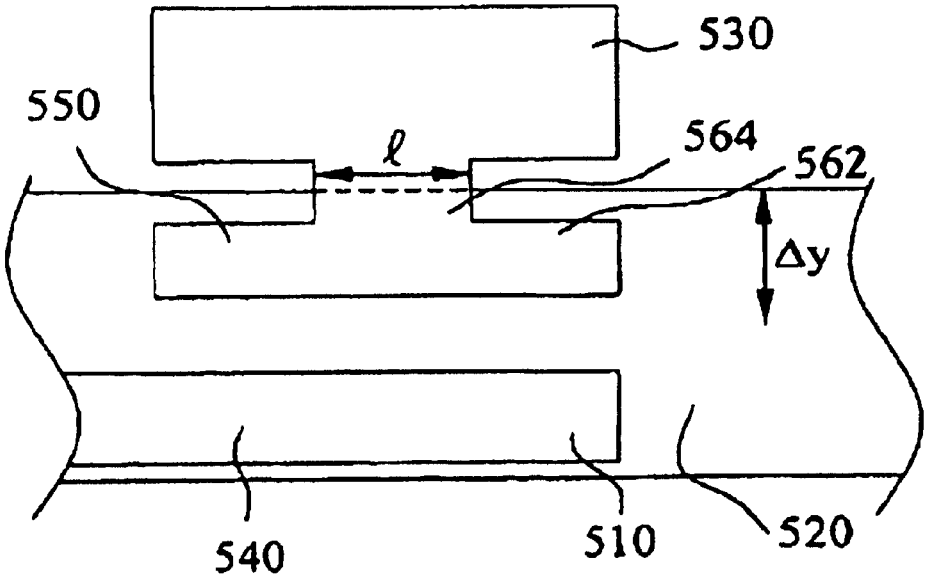
FIG. 4 is a schematic drawing showing the arrangement of a functional component in a LCD according to the present invention.

Referring to FIG. 4, the LCD comprises a pair of substrates. The lower substrate has a plurality of data (image) signal lines arranged in a longitudinal direction and a plurality of scan lines arranged in a transverse direction and respectively intersected with the data (image) signal lines. At least one functional component (thin film transistor) and one pixel electrode are provided around the intersected points between one data (image) signal line and multiple scan lines. Each functional component (thin film transistor) comprises a source 510 adapted for connecting to one data (image) signal line, a gate 520 adapted for connecting to one scan line, and a drain 530 adapted for connecting to one pixel electrode. The overlapped area 550 of the gate 520 and the drain 530 (the vertical projection of the drain 530 on the gate 520) is not a rectangular zone (see FIG. 3) but the area comprising a conducting zone 562 and a bridging zone 564. The conducting zone 562 and the bridging zone 564 are integrated into a T-shaped area. The width of the conducting zone 562 is greater than the width of the bridging zone 564. According to the present embodiment, the width of the bridging zone 564 is about one half of the width of the conducting zone 562. Thus, the LCD greatly reduces picture quality interference due to the effect of inaccurate alignment during exposure. When an alignment error of the exposure equipment occurred between two exposure zones, the overlapped area error between the drain 530 and the gate 520 (i.e., ΔyxI, wherein Δy=the error in the direction of vertical gate side between two exposure zones, and I=the width of the bridging zone in the direction of the vertical gate side) will be smaller than the overlapped area error between the drain 430 and the gate 420 of the functional component of each pixel of the panel of a conventional LCD caused by an inaccurate alignment of the exposure equipment between two exposure zones (i.e., ΔyxL, Δy=the error in the direction of vertical gate side between two exposure zones, L=the width of the drain 430 in the direction of the vertical gate 420 side, wherein L=2I). Due to equal width design of the bridging zone 564, i.e., because the width in parallel to one side of the gate 520 electrode is maintained at I, the overlapped area error between the drain 530 and the gate 520 is maintained at ΔyxI, smaller than the overlapped area error occurred according to the prior art design. Therefore, the invention greatly reduces the error due to inaccurate alignment of the exposure equipment between two exposure zones. Subject to the formula of pixel electrode feed through voltage:

$$\Delta Vp = \frac{Cgd}{Cgd + Cs + Clc}\Delta V_{Gate}$$

it is known (ΔVp is voltage variation at pixel, $\Delta V_{Gate}$ is voltage variation at the gate, Cgd is the capacitance value between the drain and the gate) that when Cgd reduced, ΔV is reduced too. The value of Cgd is subject to the overlapped area between the gate and the drain. Because the present invention reduces the overlapped area error between the drain and the gate due to an inaccurate alignment of the exposure equipment between two exposure zones, the LCD reduces Cgd and ΔVp (fee through voltage), i.e., the LCD reduces the error in brilliance due to the effect of ΔVp (fee through voltage). In general, the invention improves the uniformity of the brilliance of the display panel, reduces the phenomenon of shot mura, and increases the yield rate of LCD fabrication.

Although the present invention has been explained in relation to its preferred embodiments, it is to be understood that many other possible modifications and variations can be made without departing from the spirit and scope of the invention as hereinafter claimed.

What is claimed is:

1. A liquid crystal display device comprising:

a first substrate;

a second substrate having a plurality of data lines, a plurality of scan lines, a plurality of pixel electrodes, and a plurality of functional components having drain electrodes, gate electrodes and source electrodes, *wherein each source electrode and each drain electrode are disposed over one of said gate electrodes, and said source electrodes connect to the plurality of data lines, said gate electrodes connect to the plurality of scan lines and said drain electrodes connect to the plurality of pixel electrodes; and*

*a liquid crystal layer sandwiched and sealed between said first substrate and said second substrate,*

*wherein one of each source electrode and each drain electrode has at least one conducting zone and one bridging zone for connecting said conducting zone and other part thereof, and said bridging zone has an equal width in a direction parallel to one peripheral side of said gate electrodes, and the equal width of said bridging zone in the direction parallel to one peripheral side of said gate electrodes is smaller than a width of said conducting zone in the same direction parallel to said peripheral side of said gate electrodes*[;

wherein said gate electrodes, said signal electrodes and said drain electrodes don't directly connect each other, the projection of one of each signal electrode or each drain electrode on the surface of neighboring gate electrode having at least one conducting zone and one bridging zone for connecting said conducting zone and other part of said signal electrode and said drain electrode; and a liquid crystal layer sandwiched and sealed between said first substrate and said second substrate;

wherein said source electrodes connect to said data lines, said gate electrodes connect to said scan lines, and said drain electrodes connect to said pixel electrodes; said source electrodes, said bridging zone has an equal width in the direction parallel to one peripheral side of said gate electrode, and the width of said bridging zone in the direction parallel to one peripheral side of said gate electrode is smaller than the width of said conducting zone in the same direction parallel to said peripheral side of said gate electrode].

2. The liquid crystal display device as claimed in claim 1, wherein the *equal* width of said bridging zone parallel to said peripheral side of said gate [electrode] *electrodes* is greater than one fourth of the width of said conducting zone in the direction parallel to said peripheral side of said gate [electrode] *electrodes* but smaller than the width of said conducting zone in the same direction parallel to said peripheral side of said gate [electrode] *electrodes*.

3. The liquid crystal display device as claimed in claim 1, wherein the *equal* width of said bridging zone in the direction parallel to one peripheral side of said gate [electrode] *electrodes* is equal to one half of the width of said conducting zone in the same direction parallel to said peripheral side of said gate [electrode] *electrodes*.

4. The liquid crystal display device as claimed in claim 1, wherein said bridging zone and said conducting zone are integrated into a T-shaped zone.

5. The liquid crystal display device as claimed in claim 1, wherein said bridging zone and said conducting zone are integrated into a L-shaped zone.

6. The liquid crystal display device as claimed in claim 1, wherein said bridging zone and said conducting zone are integrated into a Z-shaped zone.

7. The liquid crystal display device as claimed in claim 1, wherein said bridging zone and said conducting zone are integrated into an II-shaped zone.

8. The liquid crystal display device as claimed in claim 1, further comprising an orientation layer coated between said substrate and said liquid crystal layer.

9. The liquid crystal display device as claimed in claim 1, further comprising a backlight module adapted for providing a light source for illumination.

*10. A pixel, comprising:*

*a data line and a scan line;*

*a functional component having a drain electrode, a gate electrode and a source electrode, wherein said source electrode is electrically connected to said data line and said gate electrode is electrically to said scan line; and*

*a pixel electrode is electrically connected to said drain electrode,*

*wherein one of said source electrode and said drain electrode has at least one conducting zone and one bridging zone for connecting said conducting zone and other part thereof, and a width of said bridging zone is smaller than a width of said conducting zone,*

*wherein said bridging zone has an equal width in a direction parallel to one peripheral side of said gate electrode, and the equal width of said bridging zone in the direction parallel to one peripheral side of said gate electrode is smaller than the width of said conducting zone in the same direction parallel to said peripheral side of said gate electrode.*

*11. The pixel as claimed in claim 10, wherein the equal width of said bridging zone parallel to said peripheral side of said gate electrode is greater than one fourth of the width of said conducting zone in the direction parallel to said peripheral side of said gate electrode but smaller than the width of said conducting zone in the same direction parallel to said peripheral side of said gate electrode.*

*12. The pixel as claimed in claim 10, wherein the equal width of said bridging zone in the direction parallel to one peripheral side of said gate electrode is equal to one half of the width of said conducting zone in the same direction parallel to said peripheral side of said gate electrode.*

*13. The pixel as claimed in claim 10, wherein said bridging zone and said conducting zone are integrated into a T-shaped zone, a L-shaped zone, a Z-shaped zone or an II-shaped zone.*

*14. A functional component, comprising:*

*a gate electrode, a drain electrode and a source electrode, wherein said drain electrode and said source electrode are disposed over said gate electrode,*

*wherein one of said source electrode and said drain electrode has at least one conducting zone and one bridging zone for connecting said conducting zone and other part thereof, and a width of said bridging zone is smaller than a width of said conducting zone,*

*wherein said bridging zone has an equal width in a direction parallel to one peripheral side of said gate electrode, and the equal width of said bridging zone in the direction parallel to one peripheral side of said gate electrode is smaller than the width of said conducting zone in the same direction parallel to said peripheral side of said gate electrode.*

*15. The functional component as claimed in claim 14, wherein the equal width of said bridging zone parallel to said peripheral side of said gate electrode is greater than one fourth of the width of said conducting zone in the direc-*

*tion parallel to said peripheral side of said gate electrode but smaller than the width of said conducting zone in the same direction parallel to said peripheral side of said gate electrode.*

*16. The functional component as claimed in claim 14, wherein the equal width of said bridging zone in the direction parallel to one peripheral side of said gate electrode is equal to one half of the width of said conducting zone in the same direction parallel to said peripheral side of said gate electrode.*

*17. The functional component as claimed in claim 14, wherein said bridging zone and said conducting zone are integrated into a T-shaped zone, a L-shaped zone, a Z-shaped zone or an II-shaped zone.*

* * * * *